(12) United States Patent
Li et al.

(10) Patent No.: US 11,152,848 B2
(45) Date of Patent: Oct. 19, 2021

(54) DRIVE CIRCUIT WITH ZERO-CROSSING DETECTION FUNCTION, AND ZERO-CROSSING DETECTION METHOD

(71) Applicant: CHINA RESOURCES POWTECH(SHANGHAI) CO., LTD., Shanghai (CN)

(72) Inventors: Jin Li, Shanghai (CN); Yong You, Shanghai (CN); Changquan Lin, Shanghai (CN); Guocheng Li, Shanghai (CN); Bingyin Luo, Shanghai (CN); Shengsheng Lu, Shanghai (CN)

(73) Assignee: CRM ICBG (wuxi) Co., ltd., Jiangsu (CN)

( * ) Notice: Subject to any disclaimer, the term of this patent is extended or adjusted under 35 U.S.C. 154(b) by 0 days.

(21) Appl. No.: 16/627,775

(22) PCT Filed: Dec. 29, 2017

(86) PCT No.: PCT/CN2017/120117
§ 371 (c)(1),
(2) Date: Dec. 31, 2019

(87) PCT Pub. No.: WO2019/007011
PCT Pub. Date: Jan. 10, 2019

(65) Prior Publication Data
US 2021/0167679 A1    Jun. 3, 2021

(30) Foreign Application Priority Data
Jul. 3, 2017 (CN) .......................... 201710531492.0

(51) Int. Cl.
*H02M 1/08* (2006.01)
*H03K 5/1536* (2006.01)
*H03K 17/687* (2006.01)

(52) U.S. Cl.
CPC .......... *H02M 1/083* (2013.01); *H03K 5/1536* (2013.01); *H03K 17/687* (2013.01)

(58) Field of Classification Search
CPC .... H02M 1/083; H03K 5/1536; H03K 17/687
(Continued)

(56) References Cited

U.S. PATENT DOCUMENTS

| 9,444,321 B2 | 9/2016 | Xu et al. | |
| 2013/0300400 A1* | 11/2013 | Zhou | H02M 3/1588 324/76.71 |
| 2015/0214829 A1* | 7/2015 | Xu | G01R 31/40 363/21.03 |

FOREIGN PATENT DOCUMENTS

CN    102735914 A    10/2012

OTHER PUBLICATIONS

Liu, Ai-meng, et al., "Zero-crossing method and achievement based on primary-side controlled flyback structure", Apr. 20, 2017 (Year: 2017).*

(Continued)

*Primary Examiner* — Tomi Skibinski

(57) ABSTRACT

A drive circuit with a zero-crossing detection function, and a zero-crossing detection method. The drive circuit comprises: a power switch transistor, a pull-up drive transistor, a first pull-down drive transistor and a second pull-down drive transistor. When an inductor starts to discharge, the first pull-down current and the second pull-down current jointly pull down a gate terminal of the power switch transistor, such that the power switch transistor is in a cut-off state; after a set time, the first pull-down current is turned off; and when the inductor ends discharging, a parasitic capacitance of the power switch transistor couples with the drop signal, and when the drop signal is detected, the pull-up current pulls up the gate terminal of the power switch (Continued)

transistor, such that the power switch transistor is in a turn-on state.

12 Claims, 2 Drawing Sheets

(58) Field of Classification Search
USPC .................................................. 327/108–112
See application file for complete search history.

(56) References Cited

OTHER PUBLICATIONS

刘艾萌等. 基于反激式原边反馈控制结构 的过零检测方法 及实现. 电子设计工程.. Apr. 20, 2017 (Apr. 20, 2017), 25(8), ISSN: 1674-6236, pp. 42 and 43 (LIU, Aimeng et al. Zero-crossing Detecting Method and Achievement Based on Primary-side Controlled Flyback Structure. Electronic Design Engineering.).

* cited by examiner

DRIVE CIRCUIT WITH ZERO-CROSSING DETECTION FUNCTION, AND ZERO-CROSSING DETECTION METHOD

CROSS REFERENCES TO RELATED APPLICATIONS

This is a Sect. 371 National Stage application of a PCT International Application No. PCT/CN2017/120117, filed on Dec. 29, 2017, which claims priority of a Chinese Patent Applications No. 2017105314920, filed on Jul. 3, 2017, the content of which is hereby incorporated by reference in its entirety for all purposes.

TECHNICAL FIELD

This disclosure relates to the field of switching power supply control, in particular to a drive circuit with zero-crossing detection function and a zero-crossing detection method

BACKGROUND

With the global focus on energy issues, the energy consumption of electronic products is becoming increasingly prominent. How to reduce standby power consumption and increase the power supply efficiency of electronic products has become an urgent problem. Although the traditional linear regulated power supply has simple circuitry structure and high reliability, it has disadvantages such as low efficiency (only 40% to 50%), large volume, large copper and iron consumption, high operating temperature, and small adjustment range. To improve efficiency, people have developed a switching mode regulated power supply with efficiency over 85% and wide voltage regulation range. In addition, it has the advantages of high accuracy of voltage regulation and no need to use a power transformer. Therefore, the switching mode regulated power supply is an ideal regulated power supply.

A switching power supply that operates in a critical conduction mode is a common switching mode regulated power supply, which performs zero-crossing detection on demagnetized inductor current, to ensure the normal operation of the switching power supply.

A traditional zero-crossing detection method performs zero-crossing detection directly using a Cgd capacitive coupling signal of a power switch in a power supply system. No additional detection devices and circuits are needed, which can reduce the area of the control chip and have an obvious cost advantage.

As shown in FIG. 1, a switching power supply drive circuit 1 includes: an input voltage Vin is connected to an inductor L' and the cathode of a freewheeling diode D', the other terminal of the inductor L' and the anode of the freewheeling diode D' are connected to the drain terminal of the power switch transistor NM1; the source terminal of the power switch transistor NM1 is grounded via the sampling resistance Rsense; the drain terminal of the pull-up transistor 11 is connected to the power supply voltage, the source terminal is connected to the gate terminal of the power switch transistor NM1, and the gate terminal is connected to the drive signal Driver1'; the drain terminal of the pull-down transistor 12 is connected to the gate terminal of the power switch transistor NM1, the source terminal is grounded, and the gate terminal is connected to the drive signal Driver2'; the inverting input terminal of the comparator 13 is connected to the gate terminal of the power switch transistor NM1, and the non-inverting input terminal is connected to a voltage reference VREF1 to produce a zero-crossing detection signal ZCD.

As shown in FIG. 2, when the inductor L' starts to discharge, the drive signal Driver1' is at low level and the drive signal Driver2' is at high level; the gate terminal voltage GATE of the power switch transistor NM1 is pulled down, the power switch transistor NM1 is at a cut-off state, and the drain terminal voltage Drain of the power switch transistor NM1 rises. When the inductor L' ends discharging, the Cgd capacitance of the power switch transistor NM1 couples the drop signal at the end of the demagnetization of the inductor to the gate terminal of the power switch transistor NM1, and obtains the zero-crossing detection signal ZCD by comparing with voltage reference VREF1.

In the above zero-crossing detection solution, after the system is demagnetized, the drop signal is coupled to the gate of the power switch transistor through a Cgd capacitance, the pull-down transistor 12 maintains a strong pull-down capability to the gate of the power switch transistor, so that the coupled drop signal will have a large loss, and the signal is too weak to be detected. In order to detect a weak drop signal, the threshold value of the comparator 13 (voltage referenceVREF1) is designed to be too close to the ground, which may lead to false detection. Failure or false detection of the zero-crossing detection may cause the power system to malfunction or even explode, bringing hidden dangers to the system reliability.

Therefore, it is urgent to improve the accuracy of the zero-crossing detection and the reliability of the system in the field.

SUMMARY

The present disclosure provides a drive circuit with zero-crossing detection function and a zero-crossing detection method for solving the reliability problem caused by false detection of zero-crossing detection function after the inductor current is demagnetized.

The present disclosure provides a drive circuit with a zero-crossing detection function, including:

A power switch transistor, a pull-up drive transistor, a first pull-down drive transistor and a second pull-down drive transistor;

The drain terminal of the power switch transistor is connected to the inductor in the switching power supply. The source terminal of the power switch transistor is grounded via a current sampling resistance, so as to control the output voltage through a turn-on and a cut-off of the power switch transistor. The parasitic capacitance Cgd between the drain terminal and the gate terminal of the power switch transistor is coupled to the drop signal after the inductor is demagnetized.

The gate terminal of the power switch transistor is connected to a power supply voltage via the pull-up drive transistor, and the control terminal of the pull-up drive transistor is connected to a first drive signal to provide a pull-up current for the gate terminal of the power switch transistor during turning on the power switch transistor;

The gate terminal of the power switch transistor is grounded via the first pull-down drive transistor and the second pull-down drive transistor, respectively, and the control terminal of the first pull-down drive transistor is connected to a second drive signal to provide a first pull-down current for the gate terminal of the power switch transistor during the initial stage of turning off the power switch transistor; the control terminal of the second pull-down drive transistor is connected to a third drive signal to provide a second pull-down current for the gate terminal of the power switch transistor during turning off the power switch transistor; the first pull-down current is greater than the second pull-down current.

Preferably, the input terminal of the inductor is connected to an input voltage, the two terminals of the inductor are connected in parallel to a freewheeling diode, a cathode of the freewheeling diode is connected to the input terminal of the inductor, and the anode of the freewheeling diode is connected to the output terminal of the inductor.

Preferably, the pull-up drive transistor is an NMOS transistor, the drain terminal of the pull-up drive transistor is connected to the power supply voltage, the source terminal of the pull-up drive transistor is connected to the gate terminal of the power switch transistor, the gate terminal of the pull-up drive transistor is connected to the first drive signal; when the first drive signal is at a high level, the pull-up drive transistor is turned on to provide a pull-up current for the gate terminal of the power switch transistor.

Preferably, the first pull-down drive transistor is an NMOS transistor, the drain terminal of the first pull-down drive transistor is connected to the gate terminal of the power switch transistor, the source terminal of the first pull-down drive transistor is grounded, and the gate terminal of the first pull-down drive transistor is connected to the second drive signal; when the second drive signal is at a high level, the first pull-down drive transistor is turned on to provide a first pull-down current for the gate terminal of the power switch transistor.

Preferably, the second pull-down drive transistor is an NMOS transistor, the drain terminal of the second pull-down drive transistor is connected to the gate terminal of the power switch transistor, the source terminal of the second pull-down drive transistor is grounded, and the gate terminal of the second pull-down drive transistor is connected to the third drive signal; when the third drive signal is at a high level, the second pull-down drive transistor is turned on to provide a second pull-down current for the gate terminal of the power switch transistor.

More preferably, the turn-on time of the first pull-down drive transistor is 0 ns to 1000 ns.

Preferably, the size of the first pull-down drive transistor is 10 to 100 times larger than that of the second pull-down drive transistor.

Preferably, the drive circuit with zero-crossing detection function further includes a comparator, the input terminal of the comparator is connected to the gate terminal of the power switch transistor and a voltage reference, respectively, so as to convert the detected drop signal after the inductor is demagnetized into a logical signal.

The present disclosure provides a zero-crossing detection method, applied to a switching power supply circuit operating in critical conduction mode. The zero-crossing detection method at least includes:

When the inductor starts to discharge, the first pull-down current and the second pull-down current jointly pull down the gate terminal of the power switch transistor, such that the power switch transistor is in a cut-off state; after a set time, the first pull-down current is turned off, the second pull-down current continues to pull down the power switch transistor, and the power switch transistor is still in a cut-off state; the set time is shorter than the discharge time of the inductor.

When the inductor ends discharging, the parasitic capacitance between the drain terminal and the gate terminal of the power switch transistor is coupled to the drop signal after the inductor is demagnetized. When the drop signal is detected, the second pull-down current is turned off, and the pull-up current pulls up the gate terminal of the power switch transistor, such that the power switch transistor is in a turn-on state, and the inductor starts to charge.

Preferably, the set time is 0 ns to 1000 ns.

More preferably, the set time is 400 ns to 500 ns.

Preferably, the first pull-down current is 10 to 100 times of the second pull-down current.

Preferably, the drop signal is coupled to the gate terminal of the power switch transistor, and then compared with a voltage reference. When the coupling signal of the drop signal is smaller than the voltage reference, the zero-crossing detection signal takes effect, and the pull-up current is formed.

As described above, the drive circuit with zero-crossing detection function and the zero-crossing detection method of the present disclosure have the following beneficial effects:

By optimizing the drive timing, the drive circuit with zero-crossing detection function and the zero-crossing detection method of the present disclosure avoid the possibility of failure or false detection of zero-crossing detection of the conventional drive circuit, thereby improving the reliability of the system.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Figure 3:
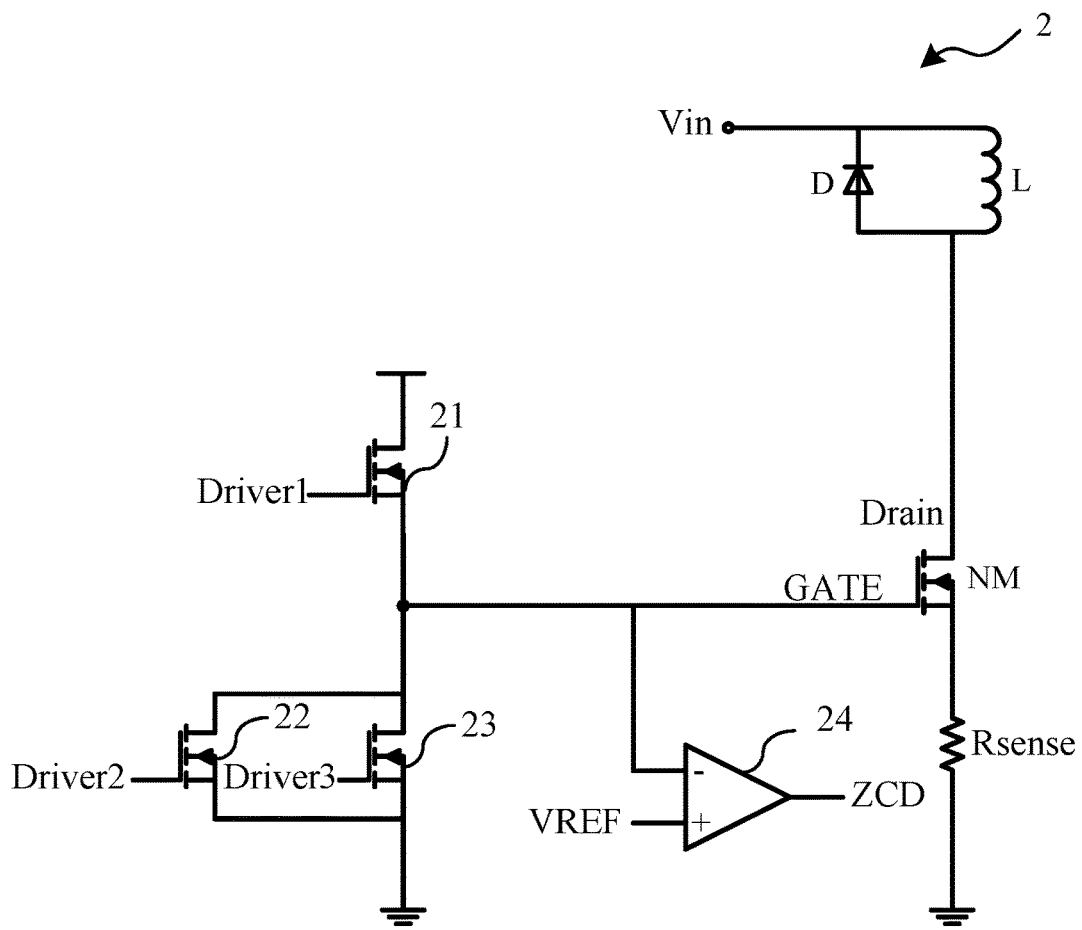
FIG. 3 is a schematic diagram of a drive circuit with zero-crossing detection function according to the present disclosure.
Figure 4:
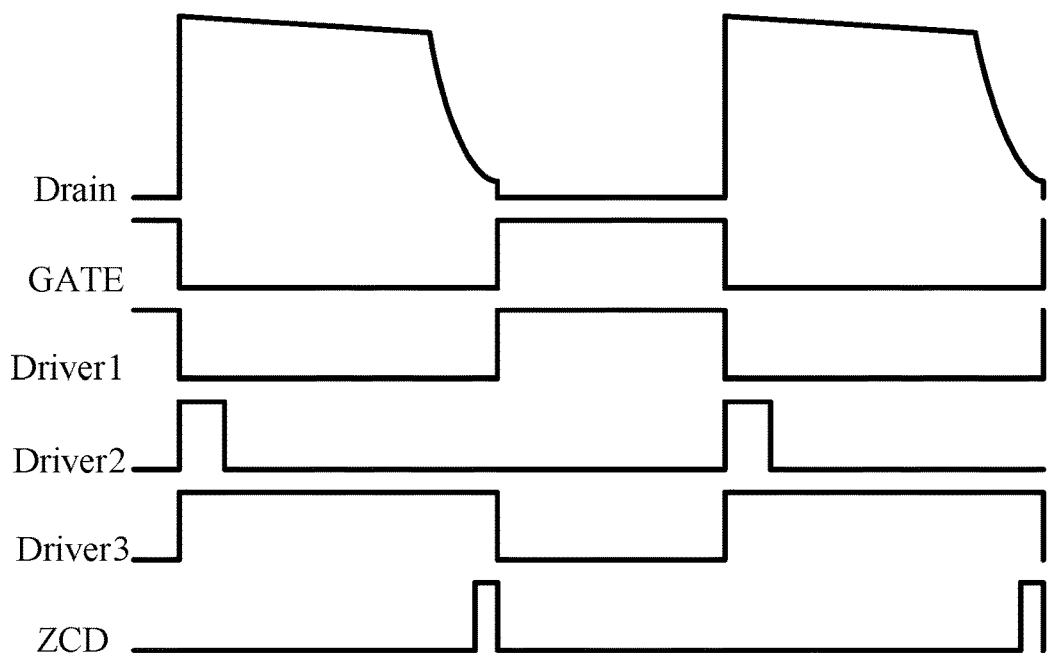
FIG. 4 is a schematic diagram of the work sequence of a drive circuit with zero-crossing detection function according to the present disclosure.

Referring to FIGS. 3-4. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

As shown in FIG. 3, the present disclosure provides a drive circuit 2 with zero-crossing detection function. The drive circuit 2 includes:

a power switch transistor NM, a pull-up drive transistor 21, a first pull-down drive transistor 22, a second pull-down drive transistor 23, and a comparator 24.

As shown in FIG. 3, the input terminal of the inductor L is connected to the power supply voltage Vin and the cathode of the freewheeling diode D, and the output terminal of the inductor L is connected to the anode of the freewheeling diode D.

As shown in FIG. 3, the drain terminal of the power switch transistor NM is connected to the output terminal of the inductor L. The source terminal of the power switch transistor NM is grounded via a current sampling resistance Rsense, so as to control the output voltage through turn-on or cut-off of the power switch transistor NM. The parasitic capacitance Cgd between the drain terminal and the gate terminal of the power switch transistor NM is coupled to the drop signal of the demagnetized inductor L.

Specifically, the power switch transistor NM is an NMOS transistor. When the gate terminal of the power switch transistor NM is at a high level, the power switch transistor NM is turned on, and a current reaches the ground through the inductor L, the power switch transistor NM and the current sampling resistance Rsense. The power switch transistor NM controls the power circuit. The parasitic capacitance Cgd between the drain terminal and the gate terminal of power switch transistor NM is used to couple the drop signal after demagnetizing. The current sampling resistance Rsense is used to set the system peak current.

As shown in FIG. 3, the gate terminal of the power switch transistor NM is connected to a power supply voltage via the pull-up drive transistor 21. The control terminal of the pull-up drive transistor 21 is connected to a first drive signal Driver1, for providing a pull-up current for the gate terminal of the power switch transistor NM during the turning on of the power switch transistor NM.

Specifically, in this embodiment, the pull-up drive transistor 21 is an NMOS transistor. The drain terminal of the pull-up drive transistor 21 is connected to the power supply voltage, the source terminal of the pull-up drive transistor 21 is connected to the gate terminal of the power switch transistor NM, the gate terminal of the pull-up drive transistor 21 is connected to the first drive signal Driver1. When the first drive signal Driver1 is at a high level, the pull-up drive transistor 21is turned on to provide a pull-up current for the gate terminal of the power switch transistor NM. Alternatively, the pull-up drive transistor 21 may be a PMOS transistor, the pull-up function can be realized by adaptively adjusting the connection relationship and the polarity of the drive signals. The devices and connection relationships are not limited to this embodiment.

As shown in FIG. 3, the gate terminal of the power switch transistor NM is grounded via the first pull-down drive transistor 22, and the control terminal of the first pull-down drive transistor 22 is connected to a second drive signal Driver2, to provide a first pull-down current for the gate terminal of the power switch transistor NM during the initial stage of turning off the power switch transistor NM.

Figure 1:
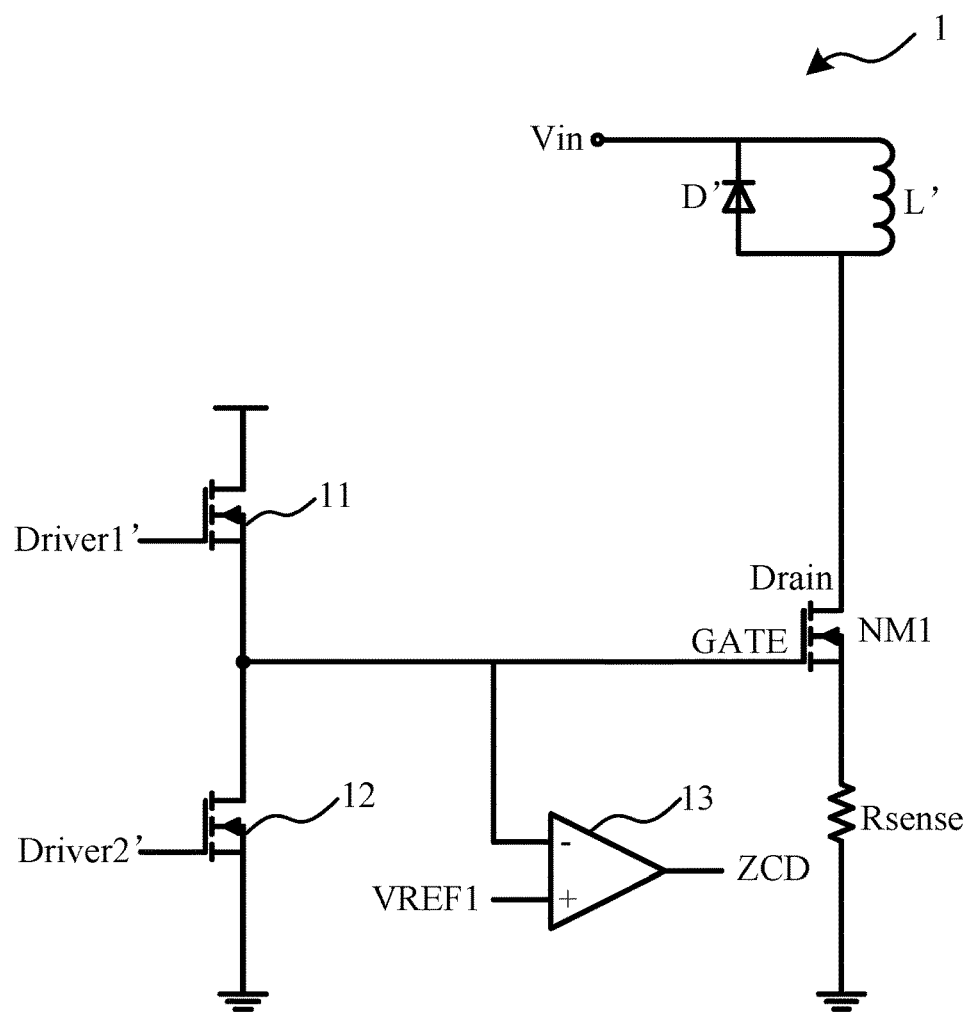
FIG. 1 is a schematic diagram of a switching power supply drive circuit.
Figure 2:
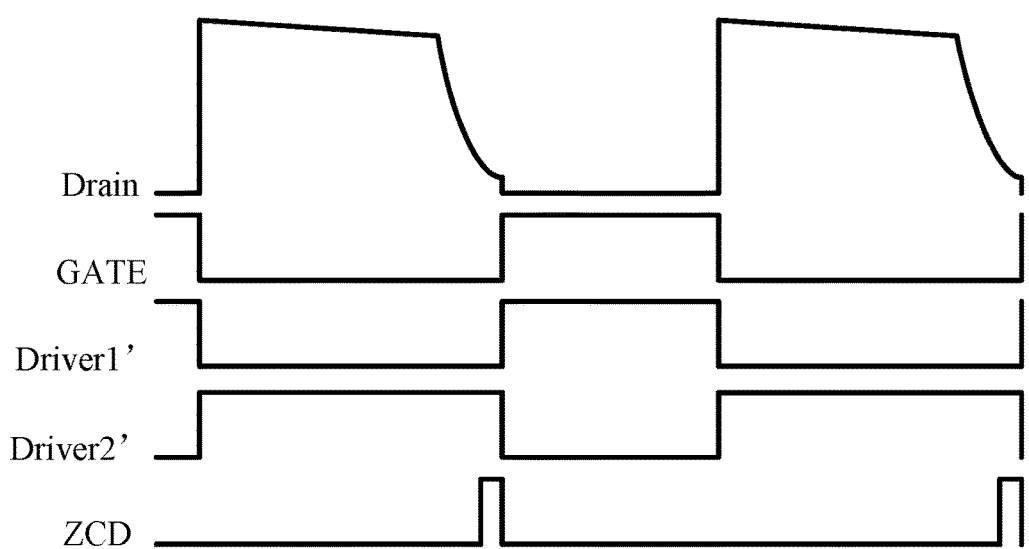
FIG. 2 is a schematic diagram of the work sequence of a drive circuit.

Specifically, in this embodiment, the first pull-down drive transistor 22 is an NMOS transistor. The drain terminal of the first pull-down drive transistor 22 is connected to the gate terminal of the power switch transistor NM, the source terminal of the first pull-down drive transistor 22 is grounded, and the gate terminal of the first pull-down drive transistor 22 is connected to the second drive signal Driver2. When the second drive signal Driver2 is at a high level, the first pull-down drive transistor 22 is turned on to provide a first pull-down current for the gate terminal of the power switch transistor NM. Alternatively, the first pull-down drive transistor 22 may be a PMOS transistor, the pull-down function can be realized by adaptively adjusting the connection relationship and the polarity of the drive signals. The devices and connection relationships are not limited to this embodiment. The size of the first pull-down drive transistor 22 is the same as the traditional pull-down transistor (the pull-down transistor 12 in FIG. 1), and pull-down capability provided is also the same.

As shown in FIG. 3, the gate terminal of the power switch transistor NM is grounded via the second pull-down drive transistor 23, and the control terminal of the second pull-down drive transistor 23 is connected to a third drive signal Driver3 to provide a second pull-down current for the gate terminal of the power switch transistor NM during turning off the power switch transistor NM.

Specifically, in this embodiment, the second pull-down drive transistor 23 is an NMOS transistor. The drain terminal of the second pull-down drive transistor 23 is connected to the gate terminal of the power switch transistor NM, the source terminal of the second pull-down drive transistor 23 is grounded, and the gate terminal of the second pull-down drive transistor 23 is connected to the third drive signal Driver3. When the third drive signal Driver3 is at a high level, the second pull-down drive transistor 23 is turned on to provide a second pull-down current for the gate terminal of the power switch transistor NM.

More specifically, during the cut-off of the power switch transistor NM, the first pull-down drive transistor 22 and the second pull-down drive transistor 23 are turned on simultaneously to discharge the gate terminal of the power switch transistor NM. However, the first pull-down drive transistor 22is turned on for only a very short time and then is turned off In this embodiment, the turn-on time of the first pull-down drive transistor 22is set as 0 ns to 1000 ns, and more preferably, the turn-on time of the first pull-down drive transistor 22 is further set as 400 ns to 500 ns. The second pull-down drive transistor 23 is always turned on during the cut-off of the power switch transistor NM. The first pull-down current is greater than the second pull-down current. The first pull-down drive transistor 22 provides a relatively large pull-down for the gate terminal of the power switch transistor NM. The second pull-down drive transistor 23 provides a weak pull-down for the gate terminal of the power switch transistor NM. In this embodiment, the size of the first pull-down drive transistor 22 is relatively large; the size of the second pull-down drive transistor 23 is relatively small. The size of the first pull-down drive transistor 22 is 10 to 100 times larger than that of the second pull-down drive transistor 23.

As shown in FIG. 3, the input terminal of the comparator 24 is connected to the gate terminal of the power switch transistor NM and a voltage reference VREF, respectively, so as to convert the detected drop signal of the inductor L after demagnetizating into a zero-crossing detection signal ZCD.

Specifically, in this embodiment, the inverting input terminal of the comparator 24 is connected to the gate terminal of the power switch transistor NM, and the non-inverting input terminal of the comparator 24 is connected to the voltage reference VREF. When the coupling signal of the drop signal is smaller than the voltage reference VREF, the zero-crossing detection signal ZCD takes effect.

As shown in FIG. 4, the present disclosure provides a zero-crossing detection method, which is applied to a switching power supply circuit operating in critical conduction mode. In this embodiment, it is realized based on the driver circuit 2 with zero-crossing detection function. The zero-crossing detection method at least includes:

When the inductor L starts to discharge, the first pull-down current and the second pull-down current jointly pull down the gate terminal of the power switch transistor NM, such that the power switch transistor NM is in a cut-off state; after a set time, the first pull-down current is turned off, the second pull-down current continues to pull down the power switch transistor NM, and the power switch transistor NM is still in a cut-off state; the set time is shorter than the discharge time of the inductor L.

Specifically, during discharging stage of the inductor, the first drive signal Driven jumps to a low level, the second drive signal Driver2 and the third drive signal Driver3 jump to a high level, providing a first pull-down current and a second pull-down current which jointly pull down the gate terminal of the power switch transistor NM. The gate terminal voltage GATE of the power switch transistor NM jumps to a low level, the power switch transistor NM is in the cut-off state, and the drain terminal voltage Drain of the power switch transistor NM rises. After a set time, the second drive signal Driver2 jumps to a low level, the first pull-down current is turned off. The second pull-down current keeps pulling down the power switch transistor NM. The gate terminal voltage GATE of the power switch NM is maintained at a low level. The power switch transistor NM is still in a cut-off state. In this embodiment, the set time is 0 ns to 1000 ns, and more specifically, the set time is 400 ns to 500 ns. The first pull-down current provides a relatively large pull-down for the gate terminal of the power switch transistor NM. The second pull-down current provides a weak pull-down for the gate terminal of the power switch transistor NM. In this embodiment, the first pull-down current is 10 to 100 times of the second pull-down current. At this time, the zero-crossing detection signal ZCD output by the comparator 24 is invalid, and in this embodiment, the zero-crossing detection signal ZCD is at a low level.

After the inductor L is discharged, the parasitic capacitance Cgd between the drain terminal and the gate terminal of the power switch transistor NM is coupled to the drop signal of the inductor L after demagnetizing. When the drop signal is detected, the second pull-down current is turned off, and the pull-up current pulls up the gate terminal of the power switch transistor NM, such that the power switch transistor NM is in a turn-on state, and the inductor L starts to charge.

Specifically, when the discharge of the inductor L is coming to an end, the drain terminal voltage Drain of the power switch transistor NM starts to drop. At this time, only the second pull-down current provided by the second pull-down drive transistor 23 provides a weak pull-down for the gate terminal of the power switch transistor NM. The drop signal is coupled to the gate terminal of the power switch transistor NM, and then is compared with the voltage reference VREF. When the coupling signal of the drop signal is smaller than the voltage reference VREF, the zero-crossing detection signal ZCD becomes effective, and in this embodiment, the zero-crossing detection signal ZCD is a high-level pulse. After the high-level pulse ends, the first drive signal Driven jumps to a high level, the second drive signal Driver2 and the third drive signal Driver3 jump to a low level, providing a pull-up current to pull up the gate terminal of the power switch transistor NM. The gate terminal voltage GATE of the power switch transistor NM jumps to a high level, the power switch transistor NM is in the turn-on state, and the drain terminal voltage Drain of the power switch transistor NM decreases. The inductor L is in a charging state.

During turning on the power switch transistor NM, the pull-up drive transistor 21 provides a pull-up current to the gate terminal of the power switch transistor NM. During the turn-off of the power switch transistor NM, the first pull-down drive transistor 22 and the second pull-down drive transistor 23 are turned on simultaneously to discharge the gate terminal of the power switch transistor NM. However, the first pull-down drive transistor 22 is turned on for only a very short time, and then is turned off, leaving only the second pull-down drive transistor 23 turned on. When designing, the first pull-down drive transistor 22 has a relatively large size, while the size of the second pull-down drive transistor 23 is very small, such that there is only a weak pull-down for the gate terminal of the power switch transistor NM. After the system demagnetization is completed, and after the drop signal is coupled to the gate terminal of the power switch transistor NM through the parasitic capacitance Cgd between the gate terminal and the drain terminal of the power switch transistor NM, the conventional drive method still maintains a strong pull-down capability for the gate terminal of the power switch transistor, so that the coupled drop signal will have a large loss. In the present disclosure, there is only a very weak pull-down when a drop signal appears, and the gate terminal of the power switch transistor NM would obtain a large drop signal, which is of great benefit for subsequent signal comparison and processing. The signal will not be too weak to be detected; the threshold of the comparator is not required to be too close to the ground. The reliability of the system can be improved, and at the same time, the risk of explosion caused by abnormal power system function can be avoided.

In summary, the present disclosure provides a drive circuit with zero-crossing detection function, and a zero-crossing detection method. The drive circuit includes: a power switch transistor, controlling the output voltage through a turn-on and a cut-off of the power switch transistor, the parasitic capacitance between the drain terminal and the gate terminal of the power switch transistor is coupled to the drop signal after of the inductor is demagnetized; the gate terminal of the power switch transistor is connected to a power supply voltage via the pull-up drive transistor, so as to provide a pull-up current for the gate terminal of the power switch transistor during the process of turning on the power switch transistor; the gate terminal of the power switch transistor is grounded via the first pull-down drive transistor and the second pull-down drive transistor, respectively, the first pull-down drive transistor provides a first pull-down current for the gate terminal of the power switch transistor during the initial stage of turning off the power switch transistor; the second pull-down drive transistor provides a second pull-down current for the gate terminal of the power switch transistor during the turning off of the power switch transistor; the first pull-down current is greater than the second pull-down current. When the inductor starts to discharge, the first pull-down current and the second pull-down current jointly pull down the gate terminal of the power switch transistor, such that the power switch transistor is in a cut-off state. After a set time, the first pull-down current is turned off, the second pull-down current continues to pull down the power switch transistor, and the power switch transistor is still in a cut-off state. The set time is shorter than the discharge time of the inductor. When the inductor ends discharging, the parasitic capacitance between the drain terminal and the gate terminal of the power switch transistor is coupled to the drop signal after the inductor is demagnetized. When the drop signal is detected, the second pull-down current is turned off, and the pull-up current pulls up the gate terminal of the power switch transistor, such that the power switch transistor is in a turn-on state, and the inductor starts to charge. By optimizing the drive sequence, the drive circuit with zero-crossing detection function and the zero-crossing detection method of the present disclosure avoid the possibility of failure or false detection of zero-crossing detection of conventional drive circuit, thereby improving the reliability of the system. Therefore, the present disclosure effectively overcomes various shortcomings in the existing technology and has high industrial utilization value.

The above-described embodiments are merely illustrative of the principles of the disclosure and its effects, and are not intended to limit the disclosure. Modifications or variations of the above-described embodiments may be made by those skilled in the art without departing from the spirit and scope of the disclosure. Therefore, all equivalent modifications or changes made by those skilled in the art without departing from the spirit and scope of the disclosure will be covered by the appended claims.

The invention claimed is:

1. A drive circuit with zero-crossing detection function, comprising:
a power switch transistor, a pull-up drive transistor, a first pull-down drive transistor, a comparator, and a second pull-down drive transistor; wherein
a drain terminal of the power switch transistor is connected to an output terminal of an inductor in a switching power supply, a source terminal of the power switch transistor is grounded via a current sampling resistance, so as to control an output voltage through a turn-on and a cut-off of the power switch transistor, a parasitic capacitance between the drain terminal and a gate terminal of the power switch transistor is coupled to a drop signal after the inductor is demagnetized, wherein an input terminal of the inductor is connected to an input voltage, the two terminals of the inductor are connected in parallel to a freewheeling diode, a cathode of the freewheeling diode is connected to the input terminal of the inductor, and an anode of the freewheeling diode is connected to the output terminal of the inductor;
the gate terminal of the power switch transistor is connected to a power supply voltage via the pull-up drive transistor, and a control terminal of the pull-up drive transistor is connected to a first drive signal to provide a pull-up current for the gate terminal of the power switch transistor during turning on the power switch transistor;
the gate terminal of the power switch transistor is grounded via the first pull-down drive transistor and the second pull-down drive transistor, respectively, a control terminal of the first pull-down drive transistor is connected to a second drive signal to provide a first pull-down current for the gate terminal of the power switch transistor during an initial stage of turning off the power switch transistor; a control terminal of the second pull-down drive transistor is connected to a third drive signal to provide a second pull-down current for the gate terminal of the power switch transistor during turning off the power switch transistor; wherein, the first pull-down current is greater than the second pull-down current, wherein the first pull-down current is turned on by the second drive signal for a predetermined time set based on a property of the inductor;
an input terminal of the comparator is connected to the gate terminal of the power switch transistor and a voltage reference, respectively, so as to convert a detected drop signal after the inductor is demagnetized into a logical signal.

2. The drive circuit with zero-crossing detection function according to claim 1, wherein the pull-up drive transistor is an NMOS transistor, a drain terminal of the pull-up drive transistor is connected to the power supply voltage, a source terminal of the pull-up drive transistor is connected to the gate terminal of the power switch transistor, a gate terminal of the pull-up drive transistor is connected to the first drive signal; when the first drive signal is at a high level, the pull-up drive transistor is turned on to provide a pull-up current for the gate terminal of the power switch transistor.

3. The drive circuit with zero-crossing detection function according to claim 1, wherein the first pull-down drive transistor is an NMOS transistor, a drain terminal of the first pull-down drive transistor is connected to the gate terminal of the power switch transistor, a source terminal of the first pull-down drive transistor is grounded, and a gate terminal of the first pull-down drive transistor is connected to the second drive signal; when the second drive signal is at a high level, the first pull-down drive transistor is turned on to provide a first pull-down current for the gate terminal of the power switch transistor.

4. The drive circuit with zero-crossing detection function according to claim 1, wherein the second pull-down drive transistor is an NMOS transistor, a drain terminal of the second pull-down drive transistor is connected to the gate terminal of the power switch transistor, a source terminal of the second pull-down drive transistor is grounded, and a gate terminal of the second pull-down drive transistor is connected to the third drive signal; when the third drive signal is at a high level, the second pull-down drive transistor is turned on to provide a second pull-down current for the gate terminal of the power switch transistor.

5. The drive circuit with zero-crossing detection function according to claim 4, wherein a turn-on time of the first pull-down drive transistor is 0 ns to 1000 ns.

6. The drive circuit with zero-crossing detection function according to claim 1, wherein a turn-on time of the first pull-down drive transistor is 0 ns to 1000 ns.

7. The drive circuit with zero-crossing detection function according to claim 1, wherein a size of the first pull-down drive transistor is 10 to 100 times larger than that of the second pull-down drive transistor.

8. A zero-crossing detection method, applied to a switching power supply circuit operating in critical conduction mode, wherein the zero-crossing detection method at least comprises:
when an inductor starts to discharge, a first pull-down current and a second pull-down current jointly pull down a gate terminal of a power switch transistor, such that the power switch transistor is in a cut-off state; after a set time, the first pull-down current is turned off, the second pull-down current continues to pull down the power switch transistor, and the power switch transistor is still in a cut-off state; wherein, the set time is shorter than a discharge time of the inductor;
when the inductor ends discharging, a parasitic capacitance between a drain terminal and a gate terminal of the power switch transistor is coupled to a drop signal after the inductor is demagnetized, when the drop signal is detected, the second pull-down current is turned off, and a pull-up current pulls up the gate terminal of the power switch transistor, such that the power switch transistor is in a turn-on state, and the inductor starts to charge, wherein an input terminal of the inductor is connected to an input voltage, the two terminals of the inductor are connected in parallel to a freewheeling diode, a cathode of the freewheeling diode is connected to the input terminal of the inductor, and an anode of the freewheeling diode is connected to the output terminal of the inductor, wherein the set time is decided at least partially based on the property of the inductor;

an input terminal of a comparator is connected to the gate terminal of the power switch transistor and a voltage reference, respectively, so as to convert a detected drop signal after the inductor is demagnetized into a logical signal.

9. The zero-crossing detection method according to claim 8, wherein the set time is 0 ns to 1000 ns.

10. The zero-crossing detection method according to claim 9, wherein the set time is 400 ns to 500 ns.

11. The zero-crossing detection method according to claim 9, wherein the first pull-down current is 10 to 100 times of the second pull-down current.

12. The zero-crossing detection method according to claim 8, wherein the drop signal is coupled to the gate terminal of the power switch transistor, then is compared with a voltage reference, when the coupling signal of the drop signal is smaller than the voltage reference, the zero-crossing detection signal takes effect, and the pull-up current is formed.

* * * * *